(12) United States Patent
Pascal et al.

(10) Patent No.: US 6,612,315 B2
(45) Date of Patent: Sep. 2, 2003

(54) BOWL, SPIN, RINSE, AND DRY MODULE, AND METHOD FOR LOADING A SEMICONDUCTOR WAFER INTO A SPIN, RINSE, AND DRY MODULE

(75) Inventors: Roy Winston Pascal, Union City, CA (US); Brian M. Bliven, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 83 days.

(21) Appl. No.: 10/013,198

(22) Filed: Nov. 2, 2001

(65) Prior Publication Data

US 2002/0096200 A1 Jul. 25, 2002

Related U.S. Application Data

(62) Division of application No. 09/470,676, filed on Dec. 23, 1999, now Pat. No. 6,497,241.

(51) Int. Cl.[7] .................................. B08B 3/02
(52) U.S. Cl. .................. 134/25.4; 134/183; 134/186; 134/902
(58) Field of Search .................. 134/104.2, 155, 134/109, 182, 183, 186, 902, 25.4

(56) References Cited

U.S. PATENT DOCUMENTS

| | | | |
|---|---|---|---|
| 3,645,581 A | * | 2/1972 | Lasch, Jr. et al. |
| 3,670,746 A | | 6/1972 | Gehrmann |
| 3,893,567 A | | 7/1975 | Davis et al. |
| 4,368,818 A | | 1/1983 | Day et al. |
| 4,651,440 A | | 3/1987 | Karl |
| 4,827,867 A | * | 5/1989 | Takei et al. |
| 4,936,448 A | | 6/1990 | Holloway |
| 5,169,408 A | * | 12/1992 | Biggerstaff et al. |
| 5,232,511 A | | 8/1993 | Bergman |
| 5,310,441 A | | 5/1994 | Tsutsumi et al. |
| 5,312,487 A | | 5/1994 | Akimoto et al. |
| 5,518,542 A | | 5/1996 | Matsukawa et al. |
| 5,591,262 A | | 1/1997 | Sago et al. |
| 5,687,752 A | | 11/1997 | Boylan |
| 5,861,061 A | | 1/1999 | Hayes et al. |
| 5,997,653 A | | 12/1999 | Yamasaka |
| 6,159,291 A | * | 12/2000 | Morita et al. |
| 6,301,434 B1 | * | 10/2001 | McDiarmid et al. |
| 6,354,313 B1 | * | 3/2002 | Florez |
| 6,497,239 B2 | * | 12/2002 | Framer et al. |
| 6,508,259 B1 | * | 1/2003 | Tseronis et al. |

FOREIGN PATENT DOCUMENTS

| | | | |
|---|---|---|---|
| EP | 0 423 761 A | | 4/1991 |
| EP | 0 893 819 A | | 1/1999 |
| JP | 59-208831 | | 11/1984 |
| JP | 63-260130 | | 10/1988 |
| JP | 63-271930 | * | 11/1988 |
| JP | 3-55840 | * | 3/1991 |
| JP | 10-4079 | * | 1/1998 |
| JP | 110111665 | * | 4/1999 |

* cited by examiner

Primary Examiner—Frankie L. Stinson
(74) Attorney, Agent, or Firm—Martine & Penilla, LLP

(57) ABSTRACT

A bowl includes a bottom wall having a generally circular shape. A sidewall extends upwardly from the bottom wall to define a cylindrical chamber. The sidewall has a projection that extends into the cylindrical chamber. The projection has a top surface that defines a step in the cylindrical chamber and a sloped surface that extends between the top surface and an inner surface of the sidewall. The top surface of the projection is sloped slightly downwardly. The sloped surface of the projection is oriented relative to the top surface such that extensions of the top surface and the sloped surface define an angle in a range from about 30 degrees to about 45 degrees. A spin, rinse, and dry module including the bowl and a method for loading a semiconductor wafer into a spin, rinse, and dry module also are described.

13 Claims, 8 Drawing Sheets

BOWL, SPIN, RINSE, AND DRY MODULE, AND METHOD FOR LOADING A SEMICONDUCTOR WAFER INTO A SPIN, RINSE, AND DRY MODULE

CROSS-REFERENCE TO RELATED APPLICATIONS

This application is a divisional of application Ser. No. 09/470,676, filed Dec. 23, 1999, now U.S. Pat. No. 6,497,241, the disclosure of which is incorporated herein by reference.

BACKGROUND OF THE INVENTION

The present invention relates generally to semiconductor fabrication and, more particularly, to a bowl, a spin, rinse, and dry (SRD) module including the bowl, and a method for loading a semiconductor wafer into an SRD module.

As the semiconductor industry moves to larger, e.g., 300 mm, wafers and to smaller, e.g., 0.18 μm and smaller, feature sizes, it is becoming increasingly more important to control wafer contamination on both the top side and also the bottom side, i.e., the backside, of wafers during wafer preparation operations. In one conventional wafer preparation operation, a wafer is spin rinsed in a spin, rinse, and dry (SRD) module. During this spin rinsing operation, deionized (DI) water is sprayed onto the top and bottom sides of a wafer as the wafer is spun at high speed. One problem with this spin rinsing operation is that particle recontamination often occurs because of turbulent air above the surface of the wafer.

FIG. 1 is a simplified schematic diagram 10 illustrating the airflow around a wafer in a conventional bowl, which forms part of an SRD module. As shown therein, wafer 12 is disposed in bowl 14. For sake of simplicity, the spindle, which spins the wafer, and the spindle fingers, which support the wafer above the spindle, have been omitted from FIG. 1. As wafer 12 spins in bowl 14, the spinning action of the wafer transfers energy to the air flowing to the surface of the wafer. This transferred energy causes the airflow above the surface of wafer 12 to become turbulent and creates recirculating air, i.e., eddies, as indicated by the arrows in FIG. 1. The amount of energy transferred to the air flowing to the surface of wafer 12 depends on the diameter and the rotational speed of the wafer. In general, the greater the amount of energy transferred to the air, the higher the eddies extend above the surface of wafer 12. The presence of eddies above the surface of wafer 12 is undesirable because particles or DI water droplets removed from the wafer can circulate in the eddies and be redeposited on an otherwise clean surface of the wafer, thereby causing recontamination.

In view of the foregoing, there is a need for a device for managing the airflow above the surface of a wafer to minimize the recontamination caused by particles and DI water droplets circulating in eddies above the wafer.

SUMMARY OF THE INVENTION

Broadly speaking, the present invention fills this need by providing a bowl that is configured to control the airflow around a wafer. The present invention also provides a spin, rinse, and dry (SRD) module including the bowl and a method for loading a semiconductor wafer into an SRD module.

In accordance with one aspect of the present invention, a bowl is provided. The bowl includes a bottom wall having a generally circular shape. A sidewall extends upwardly from the bottom wall to define a cylindrical chamber. The sidewall has a projection that extends into the cylindrical chamber. The projection has a top surface that defines a step in the cylindrical chamber and a sloped surface that extends between the top surface and an inner surface of the sidewall. The top surface of the projection is sloped slightly downwardly. The sloped surface of the projection is oriented relative to the top surface such that extensions of the top surface and the sloped surface define an angle in a range from about 30 degrees to about 45 degrees.

In one embodiment, the top surface of the projection defines an angle in a range from about 2 degrees to about 5 degrees relative to a plane perpendicular to an inner surface of the sidewall. In one preferred embodiment, the top surface of the projection defines an angle of about 3 degrees relative to a plane perpendicular to an inner surface of the sidewall and the sloped surface is oriented relative to the top surface such that extensions of the top surface and the sloped surface define an angle of about 34 degrees.

In one embodiment, an annular flow guide disposed in the bowl below the projection such that an annular exhaust opening is defined between an outer edge of the annular flow guide and an inner surface of the sidewall. In one embodiment, the distance between the outer edge of the annular flow guide and the inner surface of the sidewall is in a range from about 0.125 inch to about 0.25 inch. In one embodiment, the annular flow guide is disposed on a separator tube, which is disposed on the bottom wall. In one embodiment, the separator tube has at least three notches formed at one end thereof. The at least three notches and a bottom surface of the annular flow guide define air inlet ports that permit air to flow into the separator tube. In one embodiment, the portion of the bottom wall encompassed by the separator tube has an air exhaust port formed therein.

In accordance with another aspect of the present invention, an SRD module is provided. The SRD module includes a cylindrical tube having an upper end, a lower end, and a wafer port formed therein. The cylindrical tube also has a stop formed on an inner surface thereof. A bowl, which is configured to nest within the lower end of the cylindrical tube, is mounted on a bracket. A spindle for rotating a semiconductor wafer is mounted on a frame and extends into the bowl. A drive mechanism is coupled to the bracket for moving the bowl between a lower position and an upper position. In the lower position, the bowl is clear of the wafer port so that a wafer can be passed into and out of the cylindrical tube. In the upper position, the bowl seals off the wafer port so that a semiconductor wafer mounted on the spindle can be subjected to a spin rinsing operation.

In one embodiment, the bowl in the SRD module has the features of the bowl of the present invention. In one embodiment, an upper edge of the bowl engages the stop formed on the inner surface of the cylindrical tube when the bowl is in the upper position. In one embodiment, the upper end of the cylindrical tube has a filter disposed thereon. In one embodiment, the filter is either a HEPA filter or an ULPA filter. In one embodiment, the drive mechanism is an air cylinder.

In accordance with yet another aspect of the present invention, a method for loading a semiconductor wafer into an SRD module is provided. In this method a bowl is nested within a lower end of a cylindrical tube having a wafer port formed therein. The bowl is then moved from an upper position to a lower position to expose the wafer port. Once the bowl is in the lower position, a semiconductor wafer is passed into the cylindrical tube through the wafer port.

In one embodiment, the cylindrical tube has a wafer inlet port and a wafer outlet port formed therein. In this embodiment, the operation of moving the bowl from the upper position to the lower position exposes the wafer inlet port and the wafer outlet port. Before the semiconductor wafer is passed into the cylindrical tube through the wafer inlet port, the method further includes the operation of removing a semiconductor wafer from the cylindrical tube through the wafer outlet port.

In one embodiment, the method further includes the operations of moving the bowl from the lower position to the upper position to seal off the wafer port, and performing a spin rinsing operation on the semiconductor wafer with the bowl in the upper position. In one embodiment, the bowl is moved between the upper position and the lower position by an air cylinder. In one embodiment, the upper position is defined by a stop provided on an inner surface of the cylindrical tube.

The bowl of the present invention is configured to control the airflow around a wafer so that recontamination caused by recirculating particles and DI water droplets is minimized. In particular, the airflow directs contaminated air and particles away from the wafer. The configuration of the SRD module of the present invention in which the bowl moves allows for "open architecture" with respect to wafer loading because wafers can be loaded into the module from any direction by simply clocking, i.e., rotating, the cylindrical tube.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE INVENTION

Figure 1:
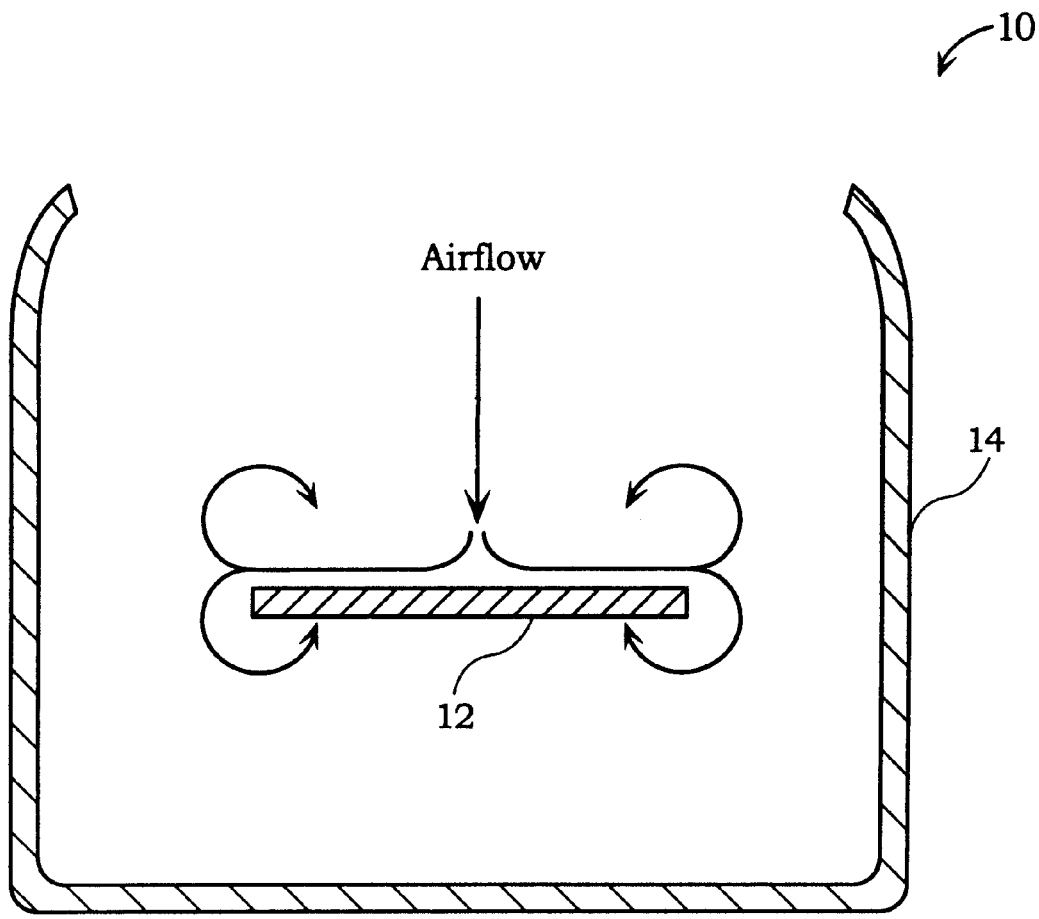
FIG. 1 is a simplified schematic diagram illustrating the airflow around a wafer in a conventional bowl.

Several exemplary embodiments of the invention will now be described in detail with reference to the accompanying drawings. FIG. 1 is discussed above in the "Background of the Invention" section.

Figure 2:
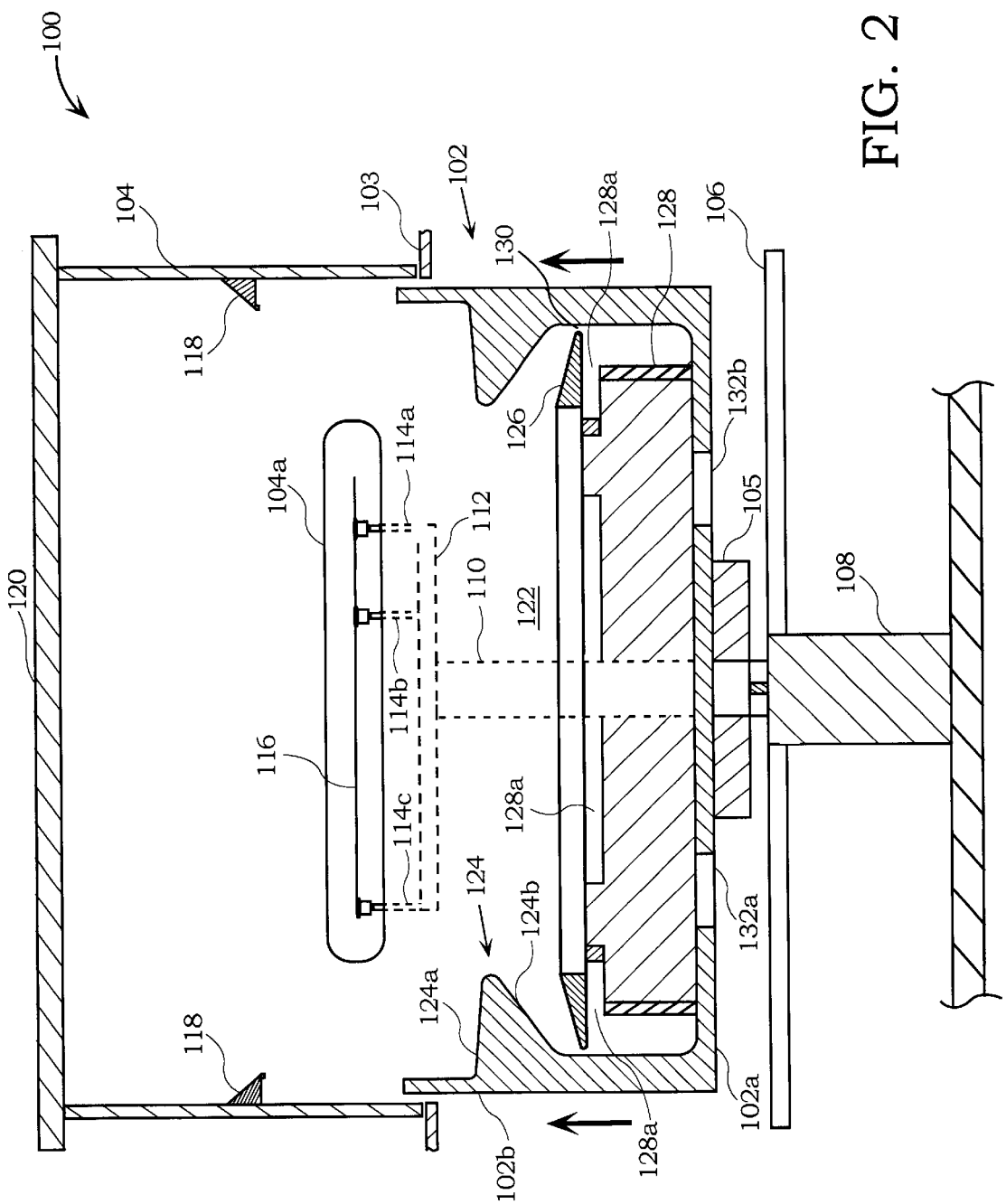
FIG. 2 is a simplified partial cross-sectional view of a spin, rinse, and dry (SRD) module in accordance with one embodiment of the invention.

FIG. 2 is a simplified partial cross-sectional view of spin, rinse, and dry (SRD) module 100 in accordance with one embodiment of the invention. As shown therein, SRD module 100 includes bowl 102, which moves within cylindrical tube 104 between an upper position and a lower position, as will be explained in more detail later. Cylindrical tube 104 is mounted on frame member 103, which is supported by other frame members not shown in FIG. 2. As shown in FIG. 2, bowl 102 is in the lower position. Bowl 102 is mounted on bracket 105, which is coupled to air cylinder 108. Spindle 110, which extends through bowl 102, is rigidly mounted on frame member 106. Other frame members (not shown in FIG. 2) support frame member 106. Spindle arm 112, which has spindle fingers 114a, 114b, and 114c extending upwardly therefrom into cylindrical tube 104, is coupled to spindle 110. Spindle fingers 114a, 114b, and 114c support wafer 116 for a spin rinsing operation, as is well known to those skilled in the art.

Figure 3:
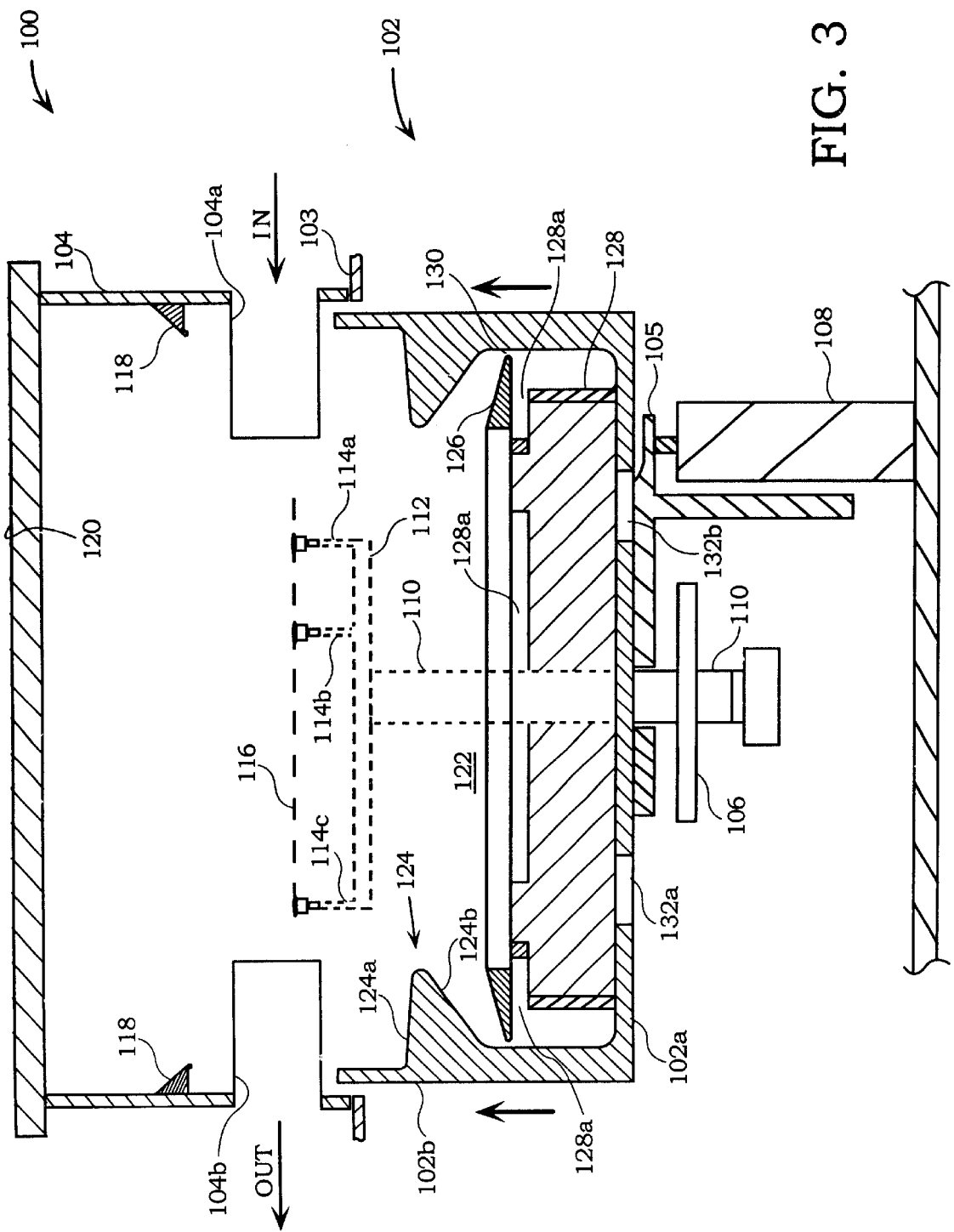
FIG. 3 is a simplified partial cross-sectional view of the SRD module shown in FIG. 2 taken along a plane rotated 90 degrees from the plane along which the cross-sectional view shown in FIG. 2 is taken.

Cylindrical tube 104 has wafer inlet port 104a and wafer outlet port 104b formed therein (wafer outlet port 104b is shown in FIG. 3). Cylindrical tube 104 may be positioned on frame member 103 so wafer inlet port 104a faces the direction from a wafer will be loaded into SRD module 100. The inner diameter of cylindrical tube 104 is slightly larger than the outer diameter of bowl 102 so that the bowl can nest within the cylindrical tube. Cylindrical tube 104 also has stop 118 provided on an inner surface thereof. Stop 118 engages the upper edge of bowl 102 when the bowl is moved into the upper position, as will be described in more detail later. As shown in FIG. 2, stop 118 is a continuous ring that extends around the inner surface of cylindrical tube 104. If desired, however, one or more discrete stops may be provided on the inner surface of cylindrical tube 104. Filter 120 is disposed on the upper end of cylindrical tube 104. Filter 120 may be any suitable filter, e.g., a high efficiency particulate arresting (HEPA) filter or an ultra low penetrating air (ULPA) filter.

Bowl 102 includes bottom wall 102a, which has a generally circular shape, and sidewall 102b, which extends upwardly from bottom wall 102a to define cylindrical chamber 122. Sidewall 102b includes projection 124, which extends into cylindrical chamber 122. Projection 124 has top surface 124a that defines a step in cylindrical chamber 122 and sloped surface 124b that extends between top surface 124a and an inner surface of sidewall 102b. Additional details regarding the shape of projection 124 are set forth below in connection with the description of FIG. 5.

Annular flow guide 126 is disposed in bowl 102 below projection 124. As shown in FIG. 2, annular flow guide 126 is in the form of a ring having an upper surface that slopes downwardly toward the outer edge of the ring. Annular flow guide 126 is disposed on separator tube 128, which sits on bottom wall 102a. More particularly, annular flow guide 126 is disposed on separator tube 128 such that annular exhaust opening 130 is defined between the outer edge of annular flow guide 126 and the inner surface of sidewall 102b. Separator tube 128 has notches 128a formed at the upper end thereof. Notches 128a and the bottom surface of annular flow guide 126 define air inlet ports the function of which will be described in more detail later. The number of notches 128a formed in separator tube 128 to define air inlet ports may be varied to suit the needs of particular applications. In one embodiment, the number of notches 128a is in the range from three to six. Air exhaust ports 132a and 132b are provided in the portion of bottom wall 102a encompassed by separator tube 128.

FIG. 3 is a simplified partial cross-sectional view of SRD module 100 taken along a plane rotated 90 degrees from the plane along which the cross-sectional view shown in FIG. 2 is taken. As shown in FIG. 3, cylindrical tube 104 has wafer inlet port 104a and wafer outlet port 104b formed therein. With bowl 102 in the lower position as shown in FIGS. 2 and 3, the area between wafer inlet port 104a and wafer outlet port 104b defines a hand off zone for loading wafers into and removing wafers from SRD module 100. By way of example, wafer 116 may be removed from SRD module 100 by inserting a suitable robotic arm into wafer outlet port 104b, grabbing wafer 116 from spindle fingers 114a, 114b, and 114c with the robotic arm, and removing wafer 116 from SRD module 100 through wafer outlet port 104b. Once wafer 116 is removed, another wafer may be loaded into SRD module 100 by inserting a wafer into wafer inlet port 104a with a robotic arm, placing the wafer in spindle fingers 114a, 114b, and 114c, and removing the robotic arm through wafer inlet port 104a.

Figure 4:
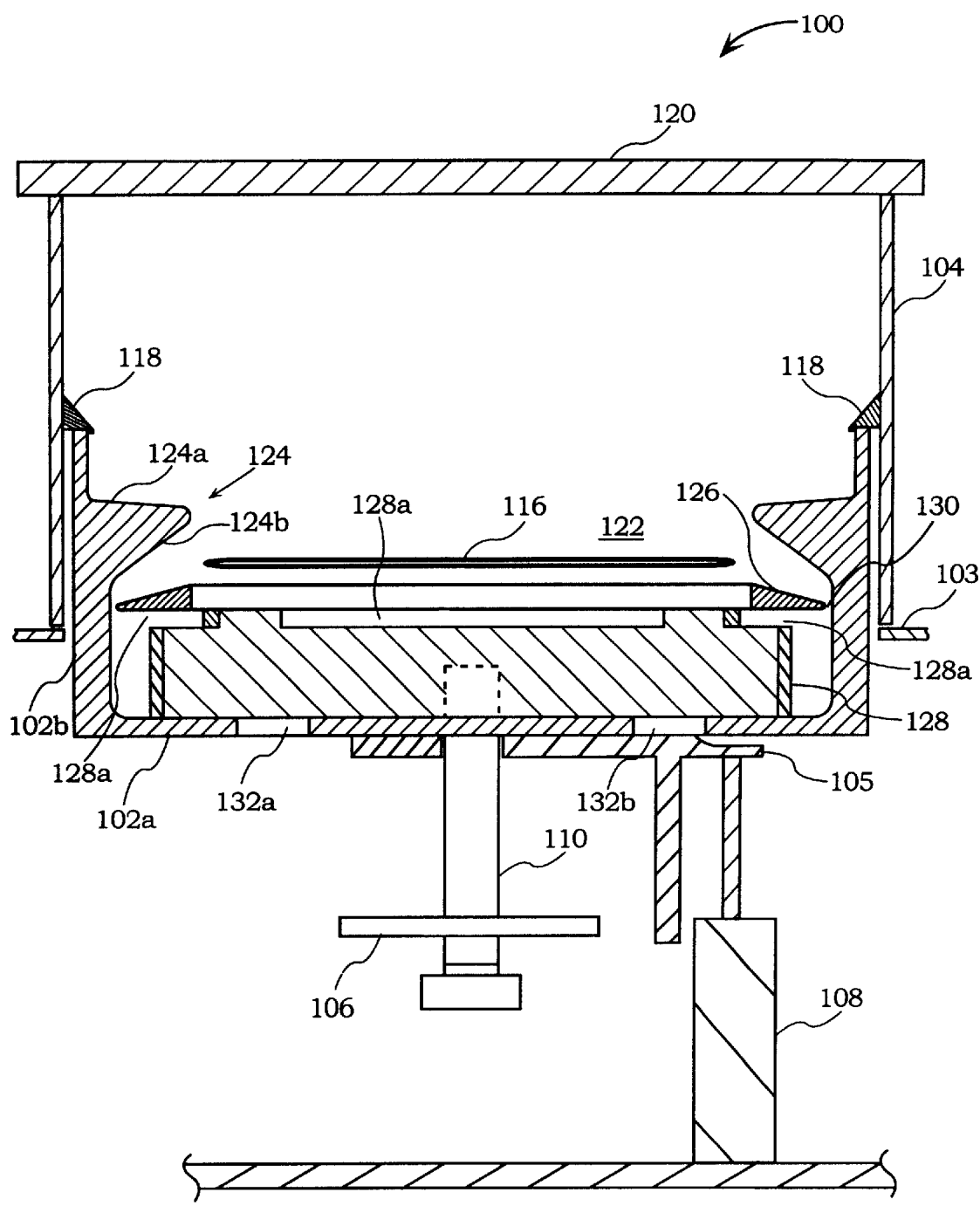
FIG. 4 is a simplified partial cross-sectional view of the SRD module shown in FIG. 2 with the bowl in the upper position.

FIG. 4 is a simplified partial cross-sectional view of SRD module 100 shown in FIG. 2 with bowl 102 in the upper position. As shown in FIG. 4, the upper edge of bowl 102 engages stop 118 provided on the inner surface of cylindrical tube 104. Bowl 102 may be raised to the upper position shown in FIG. 4 by activating air cylinder 108 to lift bracket 105 on which the bowl is mounted. As air cylinder 108 lifts bracket 105, spindle 110, which is rigidly mounted to frame member 106, remains in place. This is advantageous because it not only provides increased stability for the spindle, but also avoids the need for the additional mechanisms used to move the spindle up and down in conventional SRD modules. The location of stop 118, which defines the upper location of bowl 102, is selected so that wafer 116 is disposed slightly above the top surface of annular flow guide 126. It will be apparent to those skilled in the art that spindle arm 112 and spindle fingers 114a, 114b, and 114c shown in FIG. 2 have been omitted from FIG. 4 for ease of illustration. When bowl 102 is in the upper position, the outer surface of sidewall 102b seals off wafer inlet port 104a and wafer outlet port 104b so that a spin rinsing operation may be conducted within SRD module 100 without having either air or deionized (DI) water pass through these ports.

Figure 5:
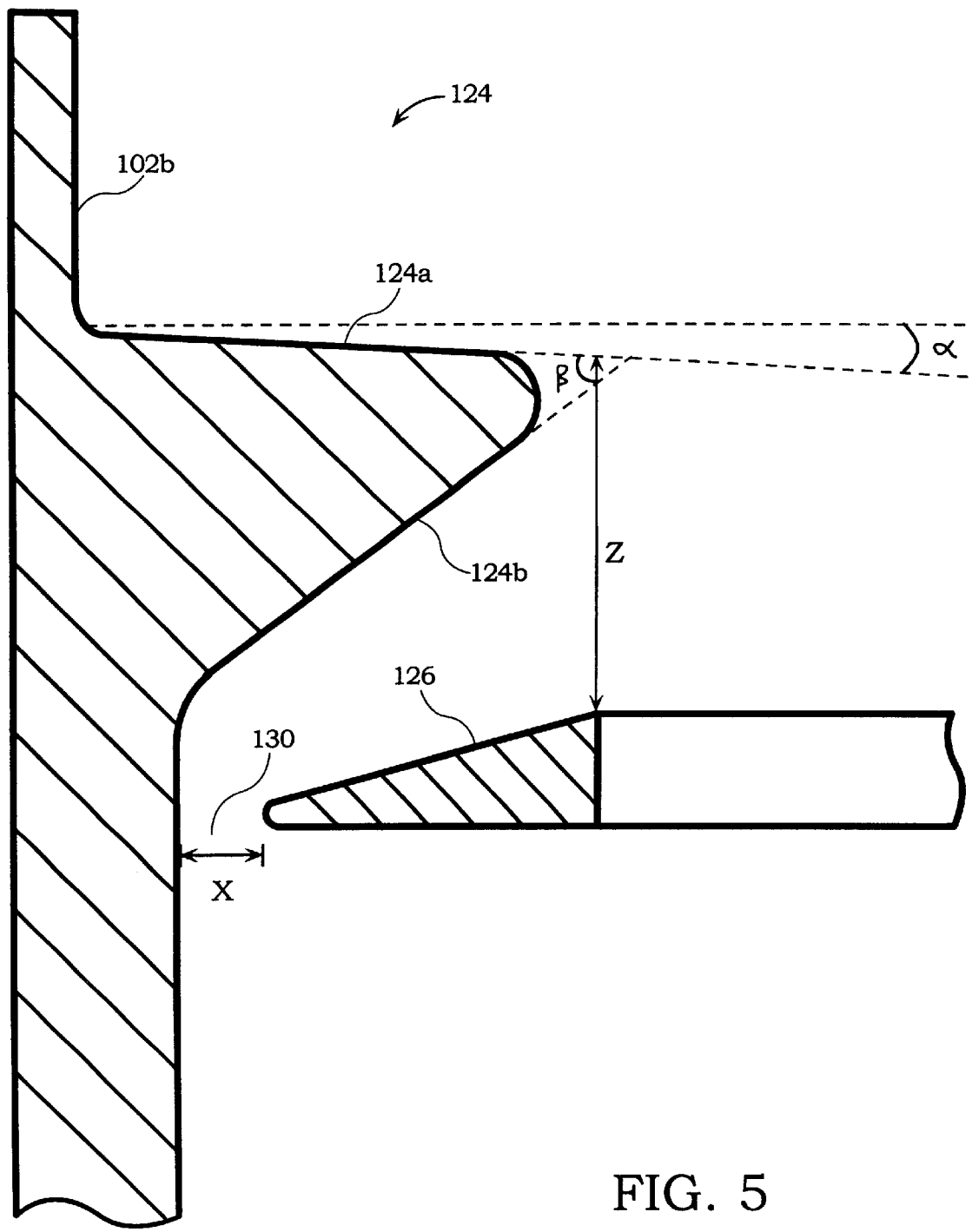
FIG. 5 is an enlarged, cross-sectional, partial view of bowl 102 shown in FIGS. 2–4 that illustrates the configuration of projection 124 and annular flow guide 126 in accordance with one embodiment of the invention.

FIG. 5 is an enlarged, cross-sectional, partial view of bowl 102 shown in FIGS. 2–4 that illustrates the configuration of projection 124 and annular flow guide 126 in accordance with one embodiment of the invention. It will be apparent to those skilled in the art that separator tube 128 shown in FIGS. 2–4 has been omitted from FIG. 5 for ease of illustration. As shown in FIG. 5, top surface 124a of projection 124 defines an angle, $\alpha$, relative to a plane perpendicular to an inner surface of sidewall 102b. In one embodiment, the angle, $\alpha$, is in a range from about 2 degrees to about 5 degrees relative to a plane perpendicular to an inner surface of sidewall 102b. In one preferred embodiment, the angle, $\alpha$, is about 3 degrees relative to a plane perpendicular to an inner surface of sidewall 102b. Extensions of sloped surface 124b of projection 124 and top surface 124a define an angle, $\beta$, in a range from about 30 degrees to about 45 degrees. In one preferred embodiment, the angle, $\beta$, is about 34 degrees.

The distance, X, between the outer edge of annular flow guide 126 and the inner surface of sidewall 102b corresponds to the width of annular exhaust opening 130. In one embodiment, the distance, X, is in a range from about 0.125 inch to about 0.25 inch. The distance, Z, corresponds to the distance between top surface 124a (as measured from an extension of top surface 124a at a point just beyond the innermost surface of projection 124) and the top surface of the inner edge of annular flow guide 126. In one embodiment, the distance, Z, is in a range from about 0.75 inch to about 1.25 inches.

Figure 6:
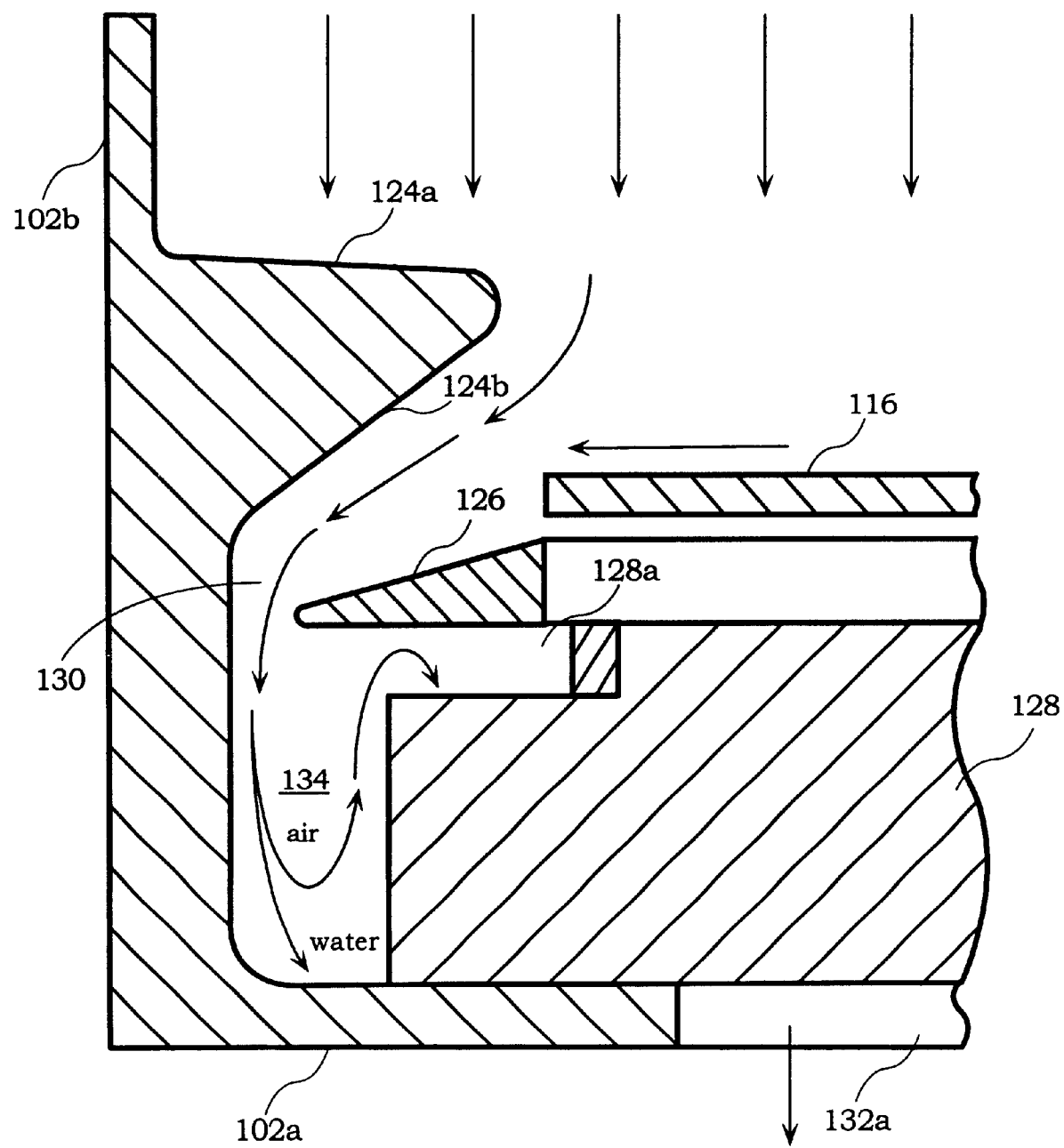
FIG. 6 is an enlarged, cross-sectional, partial view of bowl 102 shown in FIGS. 2–4 that illustrates the airflow around a wafer in accordance with one embodiment of the invention.

FIG. 6 is an enlarged, cross-sectional, partial view of bowl 102 shown in FIGS. 2–4 that illustrates the airflow around a wafer in accordance with one embodiment of the invention. As shown in FIG. 6, controlled uniform and unidirectional airflow from an appropriate source flows through cylindrical tube 104 (see FIGS. 2–4) toward the top surface of wafer 116, as indicated by the parallel arrows above projection 124. This controlled airflow into cylindrical tube 104 may be matched to the rotation speed of wafer 116. By way of example, for an 8-inch (200 mm) wafer and an incoming air velocity of about 100 feet per minute (fpm), the maximum spin speed of the wafer is about 5,000 rpm. For a 12-inch (300 mm) wafer and an incoming air velocity of about 100 fpm, the maximum spin speed of the wafer is about 3,000 rpm.

The bulbous shape of projection 124 serves three functions to minimize recontamination during a spin rinsing operation. First, the bulbous shape of projection 124 helps isolate the generation of recirculating air, i.e., eddies, which may cause recontamination as described above with reference to FIG. 1. Second, the bulbous shape of projection 124 promotes the creation of a high velocity, low pressure region near, but slightly above, the edge of wafer 116. This high velocity, low pressure region entrains particles and DI water droplets leaving the wafer during spinning and carries them toward annular exhaust opening 130 thereby preventing recontamination. Third, the bulbous shape of projection 124 deflects contaminated air, i.e., air containing particles or DI water droplets, which is circumferentially leaving wafer 116 during spinning, into the high velocity air stream directed toward annular exhaust opening 130. This avoids recontamination by preventing the contaminated air from entering the air stream above wafer 116.

Annular flow guide 126 functions to control the distance between the outer edge thereof and the inner surface of sidewall 102b and to prevent recirculation near wafer 116. The distance between the outer edge of annular flow guide 126 and the inner surface of sidewall 102b controls the flow rate in SRD module 100 (see FIGS. 2–4) based upon the available exhaust pressure in a particular fab. In one embodiment, the design pressure is a half-inch of water vacuum. The annular shape of annular exhaust opening 130 promotes uniform pressure distribution in the bottom chamber of bowl 102, i.e., the chamber defined below wafer 116, and henceforth promotes uniform flow along a radial path around bowl 102. In one embodiment, the distance between wafer 116 and bottom wall 102a, which corresponds to the height of the bottom chamber defined in bowl 102, is about 2.5 inches to about 3 inches. Air exhaust ports 132a and 132b (air exhaust port 132b is not shown in FIG. 6) are configured to provide the correct pressure drop, i.e., the pressure drop that balances the controlled airflow into bowl 102 and the air exhaust from the bowl. In one embodiment, each of air exhaust ports 132a and 132b has a diameter of about 3 inches.

The high velocity air stream that flows through annular exhaust opening 130 flows first through annular channel 134, which is defined by the inner surface of sidewall 102b and the outer surface of separator tube 128, and then through one of air inlet ports 128a into separator tube 128. As the air circulates through annular channel 134, DI water droplets are separated from the air, as indicated by the arrows labeled "air" and "water," respectively. In this manner, separator tube 128 serves to remove water from the air before the air flows into the separator tube. A drain (not shown) may be formed in bottom wall 102a to drain the water that collects in annular channel 134. The air that flows into separator tube 128 through air inlet ports 128a flows out of bowl 102 through air exhaust ports 132a and 132b to the fab exhaust via ducting (not shown in FIG. 6).

It will be apparent to those skilled in the art that annular flow guide 126 may be supported by structures other than separator tube 128. For example, if the water separation feature provided by separator tube 128 is not needed in a particular application, then it may be desirable to support annular flow guide 126 with individual legs disposed underneath the annular flow guide at approximately equal intervals.

Bowl 102, cylindrical tube 104, annular flow guide 126, and separator tube 128 may be formed of any material suitable for use in an SRD module. Exemplary materials include polypropylene and polyethylene terephthalate (PET). As shown in FIGS. 2–4, air cylinder 108 is used to move bowl 102 between the upper and lower positions. It will be apparent to those skilled in the art that other equivalent drive mechanisms, e.g., an electric cylinder, also may be used to move bowl 102 between the upper and lower positions.

If desired, spindle 110 shown in FIGS. 2–4 may be a hollow core spindle having a wafer backing plate as described in U.S. patent application Ser. No. 09/470,690 (Attorney Docket No. LAM2P128), filed on even date herewith, and entitled "Hollow Core Spindle and Spin, Rinse, and Dry Module Including the Same." The disclosure of this application, which is assigned to Lam Research Corporation, the assignee of the subject application, is incorporated herein by reference. In operation, the hollow core spindle should be disposed such that the wafer backing plate is approximately even with the top of annular flow guide 126.

Figure 7A:
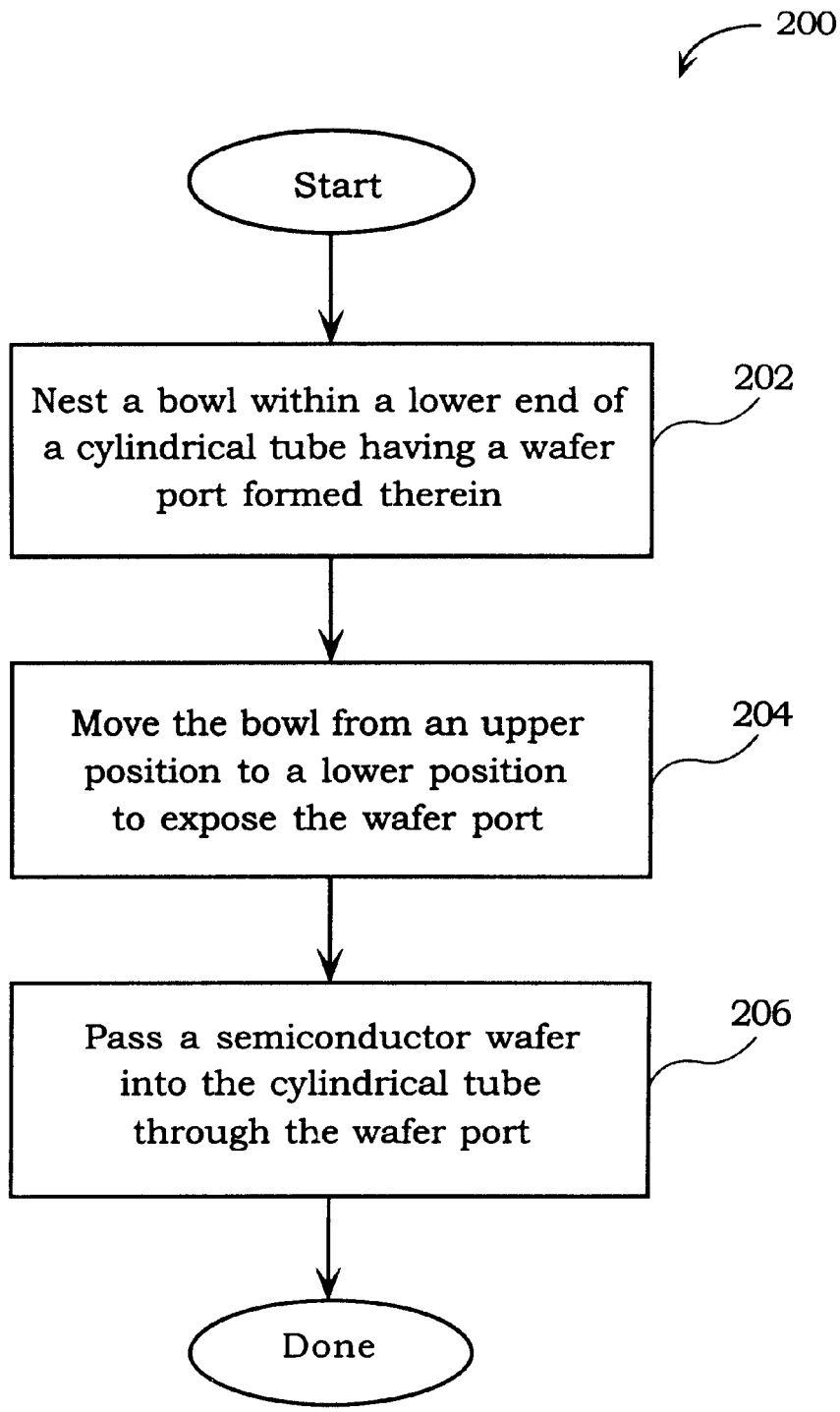
FIG. 7A is a flowchart diagram illustrating the method operations performed in loading a semiconductor wafer into an SRD module in accordance with one embodiment of the present invention.

FIG. 7A is a flowchart diagram 200 illustrating the method operations performed in loading a semiconductor wafer into an SRD module in accordance with one embodiment of the present invention. The method begins in operation 202 in which a bowl is nested within a lower end of a cylindrical tube having a wafer port formed therein. By way of example, the bowl may be nested within the lower end of a cylindrical tube as shown in FIG. 4. The cylindrical tube is oriented so that the wafer port faces the direction from which a wafer will be loaded into the SRD module. If necessary, the orientation of the cylindrical tube may be adjusted by clocking, i.e., rotating, the cylindrical tube so that the wafer port faces the direction from which a wafer will be loaded into the SRD module. Next, in operation 204, the bowl is moved from an upper position to a lower position to expose the wafer port. In one embodiment, the bowl is moved from the upper position shown in FIG. 4 to the lower position shown in FIGS. 2 and 3. The wafer port is configured to enable a wafer to be passed into the cylindrical tube with a robotic arm or other suitable wafer transport device. In one embodiment, the wafer port has a generally rectangular shape, as shown in FIG. 2. The bowl may be moved from the upper position to the lower position with any suitable drive mechanism, e.g., an air cylinder.

Once the bowl is moved to the lower position, the method proceeds to operation 206 in which a wafer is passed into the cylindrical tube through the wafer port. In one embodiment, the wafer is passed into the cylindrical tube through the wafer port with a robotic arm. Those skilled in the art are familiar with the operation of robotic arms configured to transport wafers. The wafer may be placed in spindle fingers, e.g., spindle fingers 114a, 114b, and 114c shown in FIG. 2, which form part of a spindle that rotates the wafer during a spin rinsing operation, as is well known to those skilled in the art. Once the wafer is passed into the cylindrical tube, the method is done.

Figure 7B:
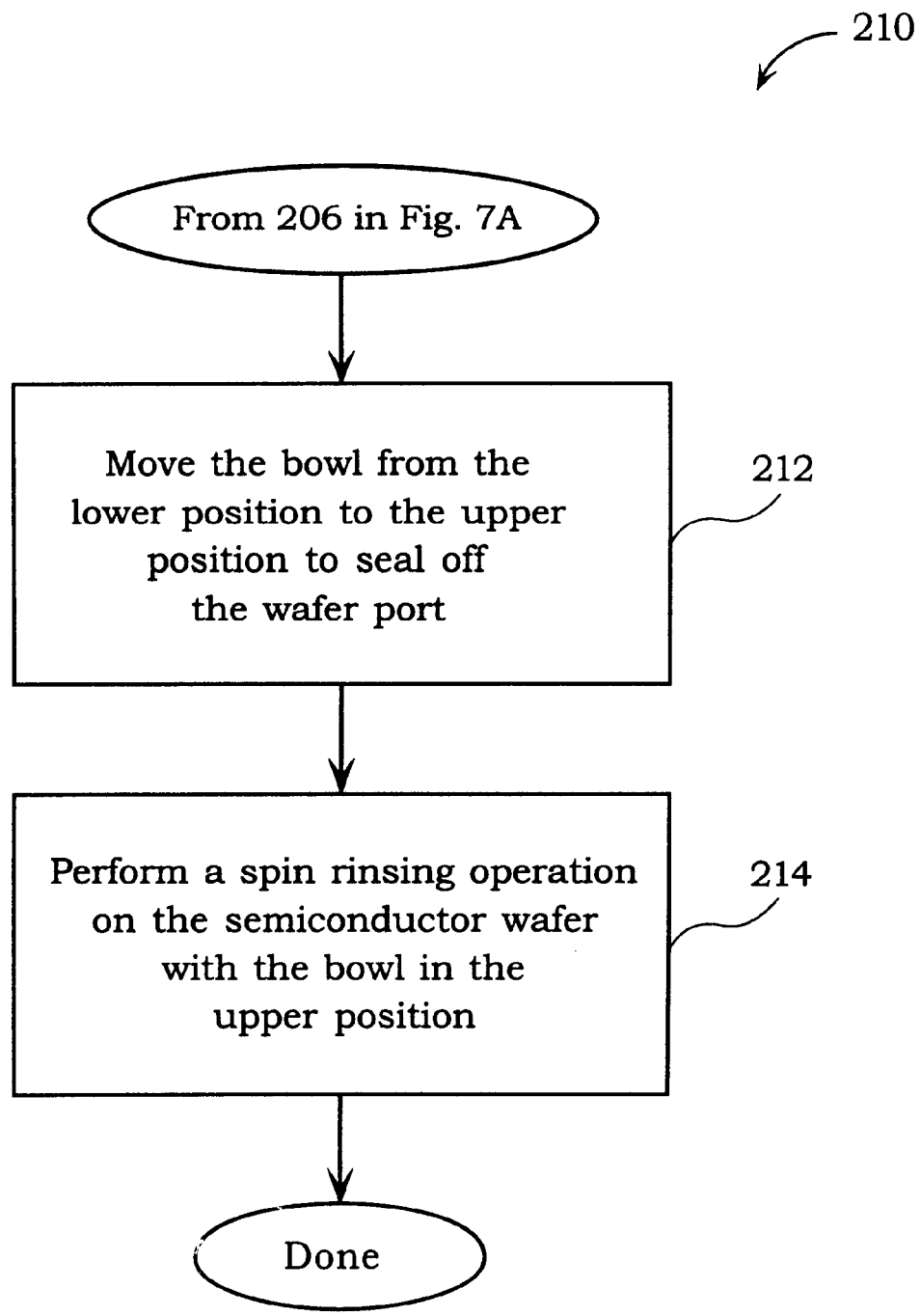
FIG. 7B is a flowchart diagram illustrating additional method operations that may be performed to spin rinse a semiconductor wafer in accordance with one embodiment of the present invention.

FIG. 7B is a flowchart diagram 210 illustrating additional method operations that may be performed to spin rinse a semiconductor wafer in accordance with one embodiment of the present invention. From operation 206 shown in FIG. 7A, the method proceeds to operation 212 in which the bowl is moved from the lower position to the upper position to seal off the wafer port. In one embodiment, the wafer is moved from the lower position shown in FIGS. 2 and 3 to the upper position shown in FIG. 4. As described above, the bowl may be moved from the lower position to the upper position with an air cylinder or other suitable drive mechanism. In one embodiment, the upper position is defined by a stop provided on an inner surface of the cylindrical tube, e.g., stop 118 shown in FIGS. 2–4. Next, in operation 214, a spin rinsing operation is performed on the wafer with the bowl in the upper position. In the spin rinsing operation, DI water is sprayed onto the top and bottom sides of the wafer as the wafer spins at a high speed, as is well known to those skilled in the art. Once the spin rinsing operation is finished, the method is done.

In one embodiment, the cylindrical tube has a wafer inlet port and a wafer outlet port, e.g., wafer inlet port 104a and wafer outlet port 104b shown in FIG. 3, formed therein. In this embodiment, the operation of moving the bowl from the upper position to the lower position exposes the wafer inlet port and the wafer outlet port. Before the wafer is passed into the cylindrical tube through the wafer inlet port, a wafer, which has already been spin rinsed, is removed from the cylindrical tube through the wafer outlet port. The wafer may be removed from the cylindrical tube through the wafer outlet port with a robotic arm.

The bowl of the present invention is configured to control the airflow around a wafer so that recontamination caused by recirculating particles and DI water droplets is minimized. In particular, the airflow directs contaminated air and particles away from the wafer. The configuration of the SRD module of the present invention in which the bowl moves allows for "open architecture" with respect to wafer loading because wafers can be loaded into the module from any direction by simply clocking, i.e., rotating, the cylindrical tube.

In summary, the present invention provides a bowl, an SRD module including the bowl, and a method for loading a semiconductor wafer into an SRD module. The invention has been described herein in terms of several exemplary embodiments. Other embodiments of the invention will be apparent to those skilled in the art from consideration of the specification and practice of the invention. The embodiments and preferred features described above should be considered exemplary, with the invention being defined by the appended claims.

What is claimed is:

1. A spin, rinse, and dry module, comprising:
   a cylindrical tube having an upper end, a lower end, and a wafer port formed therein, the cylindrical tube having a stop formed on an inner surface thereof;
   a bowl mounted on a bracket, the bowl being configured to nest within the lower end of the cylindrical tube;
   a spindle for rotating a semiconductor wafer, the spindle being mounted on a frame and extending into the bowl; and a drive mechanism coupled to said bracket for moving the bowl between a lower position at which the bowl is clear of the wafer port so that a wafer can be passed into and out of the cylindrical tube and an upper position at which the bowl seals off the wafer port so that a semiconductor wafer mounted on the spindle can be subjected to a spin rinsing operation.

2. The spin, rinse, and dry module of claim 1, wherein the bowl comprises:

a bottom wall having a generally circular shape; and a sidewall extending upwardly from the bottom wall to define a cylindrical chamber, the sidewall having a projection that extends into the cylindrical chamber, the projection having a top surface that defines a step in the cylindrical chamber and a sloped surface that extends between the top surface and an inner surface of the sidewall, the top surface being sloped slightly downwardly, and the sloped surface being oriented relative to the top surface such that extensions of the top surface and the sloped surface define an angle in a range from about 30 degrees to about 45 degrees.

3. The spin, rinse, and dry module of claim 2, wherein the top surface of the projection defines an angle in a range from about 2 degrees to about 5 degrees relative to a plane perpendicular to an inner surface of the sidewall of the bowl.

4. The spin, rinse, and dry module of claim 3, further comprising:

an annular flow guide disposed in the bowl below the projection, the annular flow guide being disposed in the bowl such that an annular exhaust opening is defined between an outer edge of the annular flow guide and an inner surface of the sidewall.

5. The spin, rinse, and dry module of claim 4, wherein the annular flow guide is disposed on a separator tube having at least three notches formed at one end thereof, the separator tube being disposed on the bottom wall, and the at least three notches and a bottom surface of the annular flow guide defining air inlet ports.

6. The spin, rinse, and dry module of claim 1, wherein an upper edge of the bowl engages the stop formed on the inner surface of the cylindrical tube when the bowl is in the upper position.

7. The spin, rinse, and dry module of claim 1, wherein the upper end of the cylindrical tube has a filter disposed thereon, the filter being one of a HEPA filter and an ULPA filter.

8. The spin, rinse, and dry module of claim 1, wherein the drive mechanism is an air cylinder.

9. A method for loading a semiconductor wafer into a spin, rinse, and dry module, comprising:

nesting a bowl within a lower end of a cylindrical tube having a wafer port formed therein;

moving the bowl from an upper position to a lower position to expose the wafer port; and passing a semiconductor wafer into the cylindrical tube through the wafer port.

10. The method of claim 9, further comprising:

moving the bowl from the lower position to the upper position to seal off the wafer port; and performing a spin rinsing operation on the semiconductor wafer with the bowl in the upper position.

11. The method of claim 10, wherein the bowl is moved between the upper position and the lower position by an air cylinder.

12. The method of claim 10, wherein the upper position is defined by a stop provided on an inner surface of the cylindrical tube.

13. The method of claim 9, wherein the cylindrical tube has a wafer inlet port and a wafer outlet port formed therein, the operation of moving the bowl from the upper position to the lower position exposes the wafer inlet port and the wafer outlet port, the semiconductor wafer is passed into the cylindrical tube through the wafer inlet port, and, before the operation of passing the semiconductor wafer into the cylindrical tube, the method further comprises the operation of:

removing a semiconductor wafer from the cylindrical tube through the wafer outlet port.

\* \* \* \* \*